(12) United States Patent
Yamamoto et al.

(10) Patent No.: US 12,304,351 B2
(45) Date of Patent: May 20, 2025

(54) SYSTEM FOR SETTING POWER SUPPLY OF REUSABLE SECONDARY CELL MODULE

(71) Applicant: DENSO CORPORATION, Kariya (JP)

(72) Inventors: Nobuo Yamamoto, Kariya (JP); Shuhei Yoshida, Kariya (JP); Katsuki Hayashi, Kariya (JP); Takehiko Yamaki, Kariya (JP); Hiroyasu Suzuki, Kariya (JP); Yuya Minabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 978 days.

(21) Appl. No.: 17/377,692

(22) Filed: Jul. 16, 2021

(65) Prior Publication Data

US 2021/0339653 A1  Nov. 4, 2021

Related U.S. Application Data

(63) Continuation of application No. PCT/JP2019/047990, filed on Dec. 9, 2019.

(30) Foreign Application Priority Data

Jan. 16, 2019 (JP) ................................ 2019-005182

(51) Int. Cl.
*B60L 58/22* (2019.01)
*B60L 58/16* (2019.01)
(Continued)

(52) U.S. Cl.
CPC .............. *B60L 58/22* (2019.02); *B60L 58/16* (2019.02); *G01R 31/392* (2019.01);
(Continued)

(58) Field of Classification Search
CPC ...... B60L 58/22; B60L 58/16; B60L 2260/54; G01R 31/367; G01R 31/392;
(Continued)

(56) References Cited

U.S. PATENT DOCUMENTS

| 9,285,433 | B2 * | 3/2016 | Kurimoto | ............... B60L 58/16 |
|---|---|---|---|---|
| 12,083,926 | B2 * | 9/2024 | Trnka | ....................... B60L 58/16 |
| 2014/0019001 | A1 * | 1/2014 | Nishizawa | ............ H01M 10/48 |
| | | | | 701/31.9 |
| 2014/0195181 | A1 | 7/2014 | Nishizawa | |

(Continued)

FOREIGN PATENT DOCUMENTS

| CN | 103515661 A | 1/2014 |
|---|---|---|
| EP | 1837944 A2 | 9/2007 |

(Continued)

OTHER PUBLICATIONS

Mar. 3, 2020 International Search Report issued in International Patent Application No. PCT/JP2019/047990.

*Primary Examiner* — Edward Tso
*Assistant Examiner* — Aaron Piggush
(74) *Attorney, Agent, or Firm* — Oliff PLC

(57) ABSTRACT

In a system for setting power supply of reusable secondary cell modules, a degradation level estimation unit estimates a degradation level of a cell-module performance of each of a plurality of secondary cell modules, based on: the history information items about the respective the secondary cell modules acquired by a history information collection unit; and the cell-module performances of the respective secondary cell modules collected by a cell performance collection unit. A suppliable quantity prediction unit predicts a suppliable quantity of power of each of the plurality of secondary cell modules in accordance with the degradation level of the cell-module performance of a corresponding one of the plurality of secondary cell modules. A supply balance setting unit sets a power supply balance among the plurality of secondary cell modules based on the suppliable quantity of power of each of the plurality of secondary cell modules predicted by the prediction unit.

6 Claims, 7 Drawing Sheets

(51) Int. Cl.
*G01R 31/392* (2019.01)
*G01R 31/396* (2019.01)
*H01M 10/48* (2006.01)
*H01M 50/204* (2021.01)
*G01R 31/367* (2019.01)

(52) U.S. Cl.
CPC .......... *G01R 31/396* (2019.01); *H01M 10/48* (2013.01); *H01M 50/204* (2021.01); *B60L 2260/54* (2013.01); *G01R 31/367* (2019.01); *H01M 2220/20* (2013.01)

(58) Field of Classification Search
CPC .................. G01R 31/396; H01M 2220/20; H01M 10/48; H01M 10/44; H01M 50/204; Y02W 30/84; Y02T 10/70
USPC ................. 320/104, 132, 134, 136
See application file for complete search history.

(56) References Cited

U.S. PATENT DOCUMENTS

| | | |
|---|---|---|
| 2014/0292283 A1 | 10/2014 | Timmons et al. |
| 2014/0320144 A1 | 10/2014 | Nakaya |
| 2015/0093611 A1 | 4/2015 | Obata |
| 2016/0275727 A1 | 9/2016 | Kurimoto |
| 2017/0324124 A1* | 11/2017 | Nakaya .................. B60L 58/12 |
| 2018/0299511 A1* | 10/2018 | Kim ..................... G01R 31/392 |

FOREIGN PATENT DOCUMENTS

| | | |
|---|---|---|
| JP | 2010-181986 A | 8/2010 |
| JP | 2013-25995 A | 2/2013 |
| JP | 2013-084198 A | 5/2013 |
| JP | 2013-140631 A | 7/2013 |
| JP | 5699840 B2 * | 4/2015 |

* cited by examiner

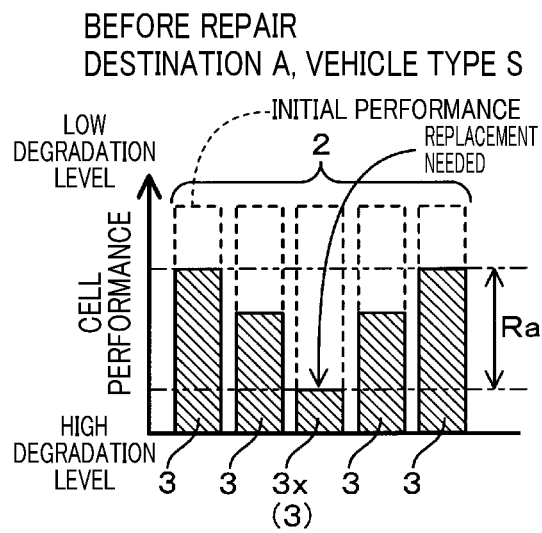
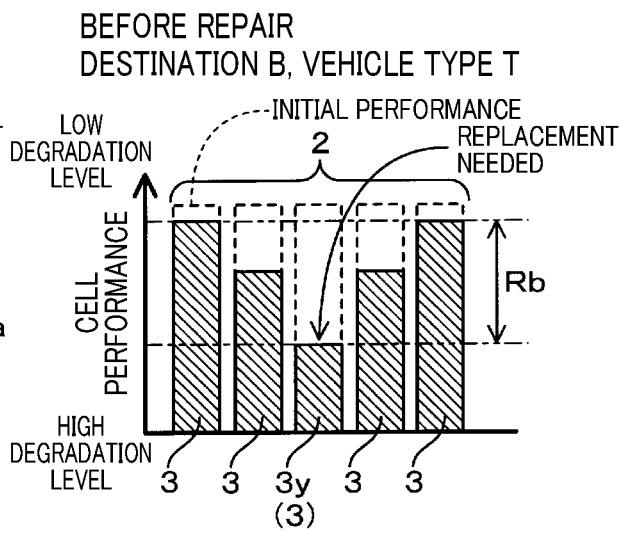
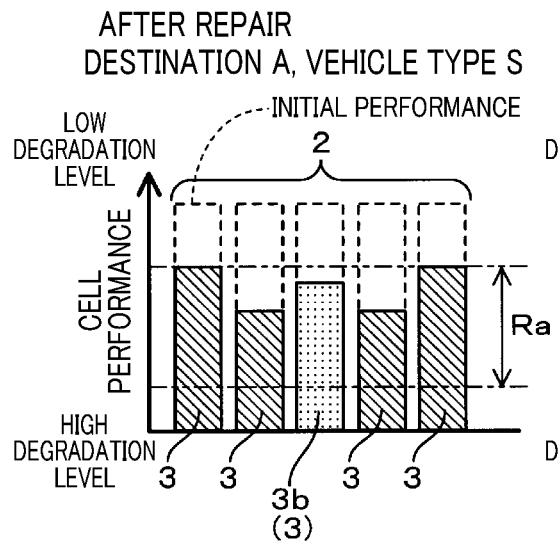
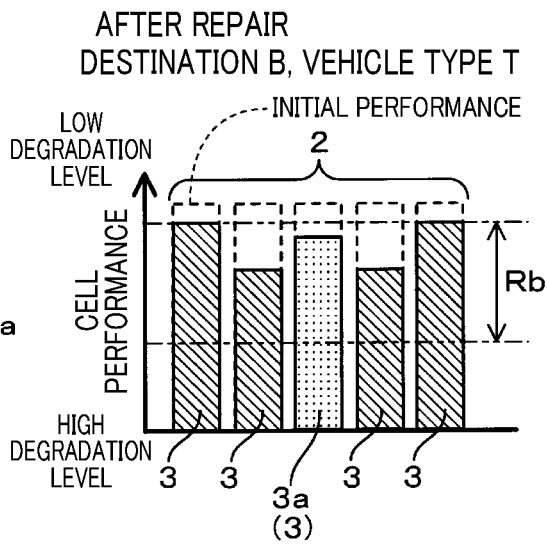

MONTHS ELAPSED (MONTHS)

RUNNING DISTANCE (km)

SYSTEM FOR SETTING POWER SUPPLY OF REUSABLE SECONDARY CELL MODULE

CROSS-REFERENCE TO RELATED APPLICATION

The present application is a continuation application of International Application No. PCT/JP2019/047990, filed on Dec. 9, 2019, which claims priority to Japanese Patent Application No. 2019-5182, filed on Jan. 16, 2019. The contents of these applications are incorporated herein by reference in their entirety.

BACKGROUND

Technical Field

The present disclosure relates to a system for setting power supply of reusable secondary cell modules.

Background Art

In recent years, batteries widely used for vehicles and the like have been reused. For the reuse of batteries, they are ranked by the performance of secondary cells constituting the batteries, and the batteries are provided in accordance with the needs at supply destinations. For example, according to an configuration, used vehicles equipped with batteries are collected from the market and the like to acquire the conditions of the vehicles and battery performance, the expected remaining lifetimes of the vehicles and future battery performance are predicted, and the prediction results are stored in a database. Then, based on the database, the suppliable quantity of power of batteries to be reused is predicted.

SUMMARY

In the present disclosure, provided is a system for setting power supply of reusable secondary cell modules as the following.

The system for setting power supply of reusable secondary cell modules includes: a history information collection unit; a cell performance collection unit; a degradation level estimation unit configured to estimate a degradation level of a cell-module performance of each of a plurality of secondary cell modules; a prediction unit configured to predict a suppliable quantity of power of each of the plurality of secondary cell modules in accordance with the degradation level of the cell-module performance of a corresponding one of the plurality of secondary cell modules; and a supply balance setting unit configured to set a power supply balance among the plurality of secondary cell modules based on the suppliable quantity of power of each of the plurality of secondary cell modules predicted by the prediction unit, and the cell pack constituted by the plurality of secondary cell modules is configured to be installable in various types of vehicles different from each other.

BRIEF DESCRIPTION OF THE DRAWINGS

The foregoing and other objects, features, and advantages of the present disclosure will be more clarified by the following detailed descriptions with reference to the accompanying drawings. The drawings are as follows:

FIGS. 3A and 3B are conceptual diagrams showing cell-module performance of secondary cell modules before repair in the first embodiment, and FIGS. 3C and 3D are conceptual diagrams showing cell-module performance of the secondary cell modules after repair in the first embodiment;

DETAILED DESCRIPTION OF THE PREFERRED EMBODIMENTS

[PTL 1] WO 2012/133212

Figure 1:
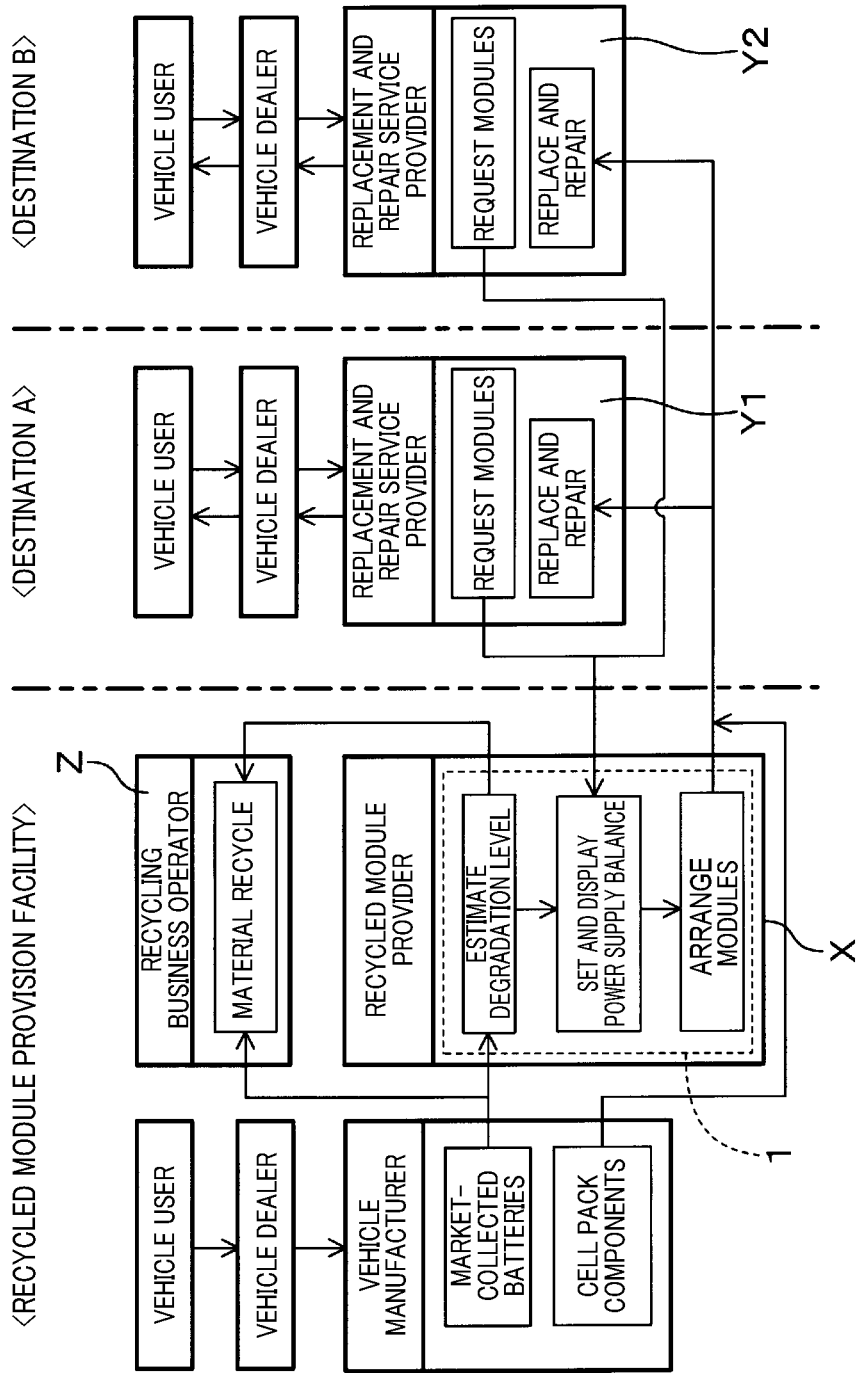
FIG. 1 is a conceptual diagram describing an environment in which a system for setting power supply in a first embodiment is utilized.

Some batteries mounted in vehicles and the like are provided in the form of a cell pack with an appropriate combination of secondary cell modules in predetermined units, and this offers the versatility of use for vehicles and apparatuses with different capacities. Along with the use of such a cell pack, the plurality of secondary cell modules constituting the cell pack will exhibit variations in degradation level and battery performance. If the variations in degradation level among the plurality of secondary cell modules constituting the cell pack become too great, the cell pack may be diagnosed as defective. In such a case, even though other secondary cell modules may be have low degradation levels, the cell pack itself needs to be replaced. Thus, it is conceivable that the secondary cell modules may instead be individually reused. However, the performance of the secondary cell modules to be reused varies depending on the region of destinations where the secondary cell modules will be reused, the vehicles and apparatuses into which the secondary cell modules will be mounted, and the necessary warranty period. If the configuration disclosed in PTL 1 is applied to cell packs having such a plurality of secondary cell modules, even though the suppliable quantity of power of cell packs can be predicted, the suppliable quantity of power of secondary cell modules cannot be predicted with high accuracy. Thus, there is room for improvement in the reuse rate of the secondary cell modules.

The present disclosure has been made in view of such circumstances and is intended to provide a system for setting power supply of reusable secondary cell modules that improves the reuse rate of secondary cell modules.

An aspect of the present disclosure is a system for setting power supply of reusable secondary cell modules, the system includes: a history information collection unit configured to collect a history information item on how each of a plurality of secondary cell modules has been used, the plurality of secondary cell modules constituting a cell pack;

a cell performance collection unit configured to collect a cell-module performance of each of the plurality of secondary cell modules; a degradation level estimation unit configured to estimate a degradation level of the cell-module performance of each of the plurality of secondary cell modules, based on: the history information items about the respective the secondary cell modules acquired by the history information collection unit; and the cell-module performances of the respective secondary cell modules collected by the cell performance collection unit; a prediction unit configured to predict a suppliable quantity of power of each of the plurality of secondary cell modules in accordance with the degradation level of the cell-module performance of a corresponding one of the plurality of secondary cell modules; and a supply balance setting unit configured to set a power supply balance among the plurality of secondary cell modules based on the suppliable quantity of power of each of the plurality of secondary cell modules predicted by the prediction unit, and the cell pack constituted by the plurality of secondary cell modules is configured to be installable in various types of vehicles different from each other.

In the system for setting power supply of reusable secondary cell modules, the history information items and cell performance are acquired for each of the secondary cell modules constituting the cell pack to estimate the degradation level of the corresponding one of the secondary cell modules. Based on the results of estimation, the suppliable quantity of power of the reusable secondary cell modules is predicted in accordance with the cell performance. Then, based on the results of suppliable quantity of power prediction, the power supply balance among the secondary cell modules is set in accordance with the cell performance. Accordingly, the supply balance is set in units of the secondary cell modules in accordance with the cell performance, which allows for high-accuracy setting of the power supply balance among the secondary cell modules. This improves the reuse rate of the secondary cell modules.

As stated above, according to the present disclosure, it is possible to provide a system for setting power supply of reusable secondary cell modules that improves the reuse rate of the secondary cell modules.

The reference signs within parentheses described in the claims indicate correspondence with specific means in embodiments described later, and do not limit the technical scope of the present disclosure.

First Embodiment

An embodiment of the above-mentioned system for setting power supply of reusable secondary cell modules will be described with reference to FIGS. 1 to 7.

Figure 2:
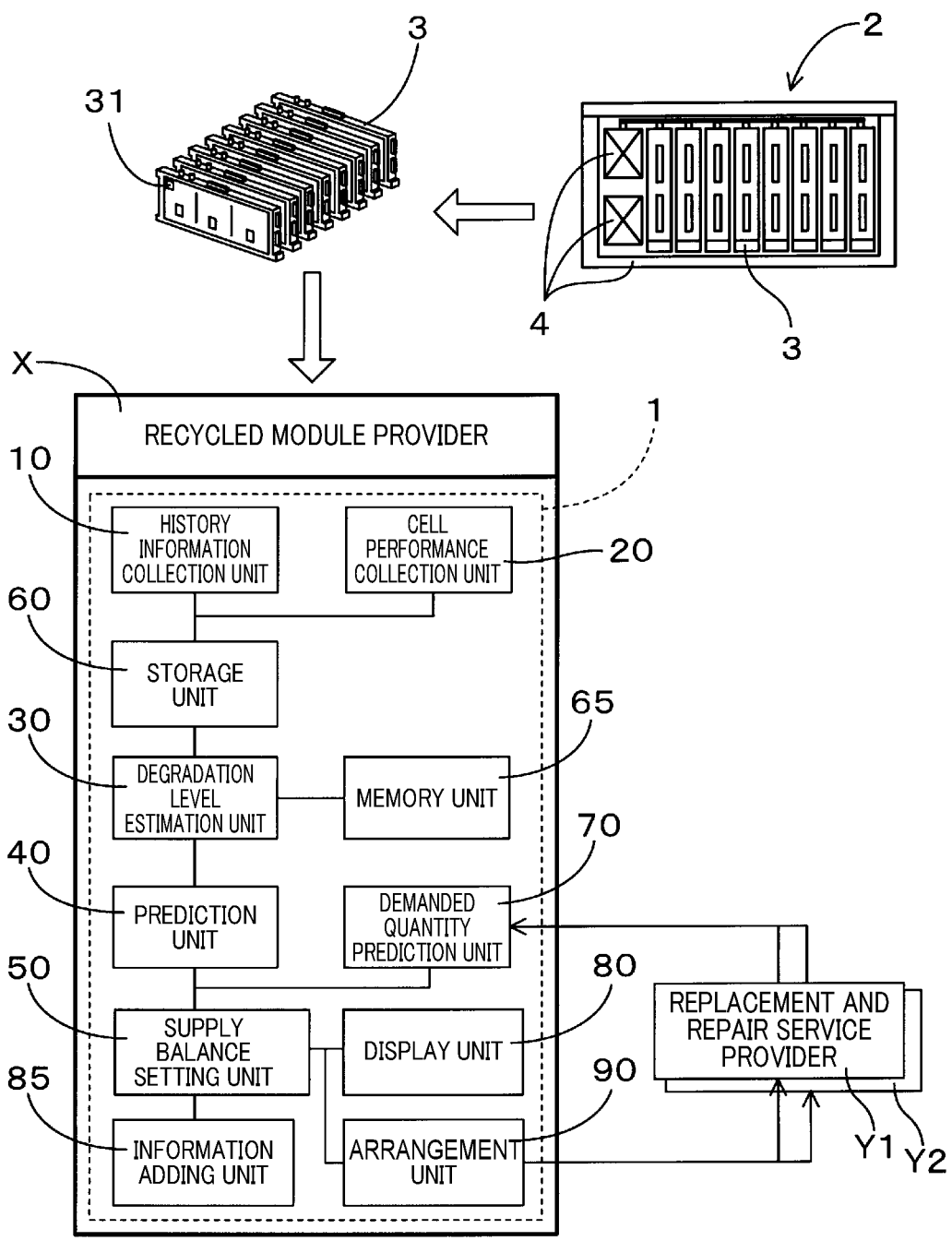
FIG. 2 is a conceptual diagram showing a configuration of the system for setting power supply in the first embodiment.
Figure 4A:
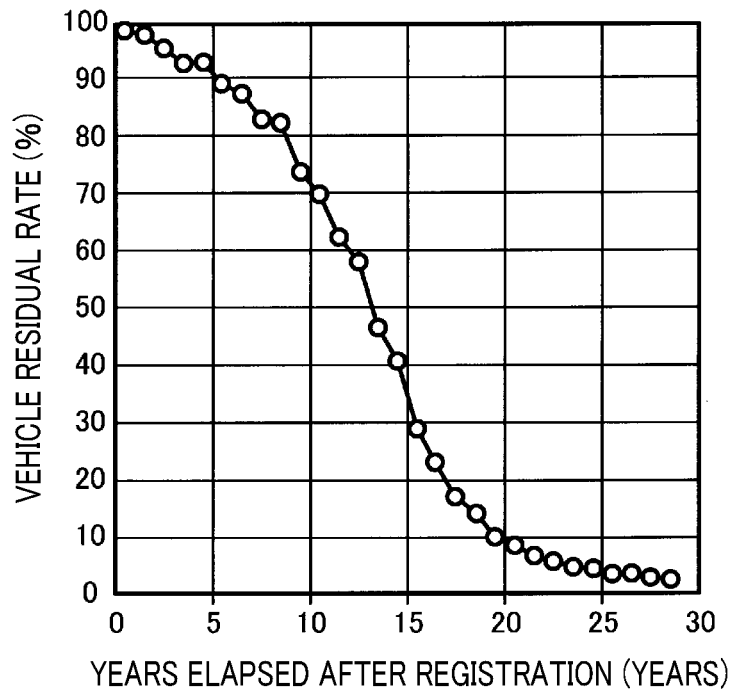
FIG. 4A is a diagram showing the transition of vehicle residual ratio in the first embodiment.
Figure 4B:
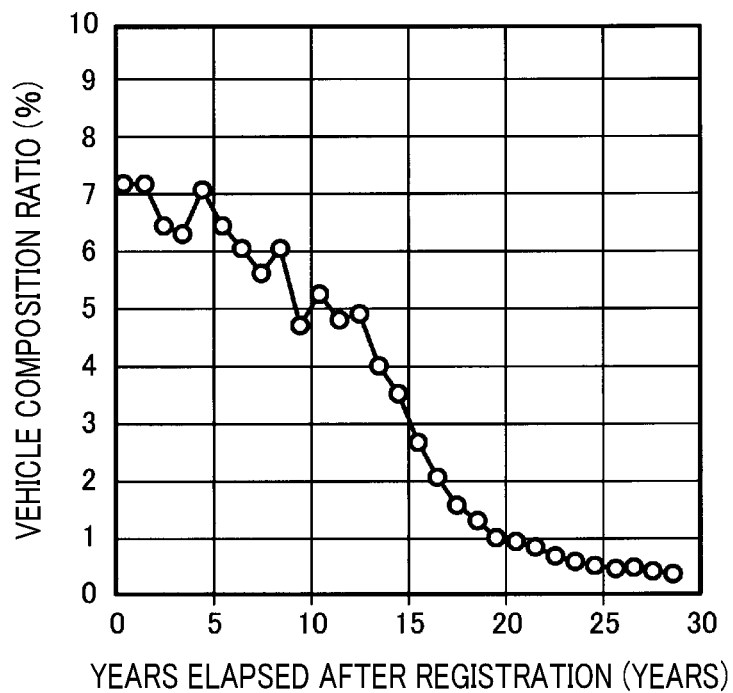
FIG. 4B is a diagram showing the transition of vehicle composition ratio in the first embodiment.

As shown in FIG. 2, a system for setting power supply of reusable secondary cell modules 1 in the present embodiment has a history information collection unit 10, a cell performance collection unit 20, a degradation level estimation unit 30, a prediction unit 40, and a supply balance setting unit 50.

The history information collection unit 10 acquires the use history of a plurality of secondary cell modules 3 constituting a cell pack 2.

The cell performance collection unit 20 acquires the cell-module performance of the plurality of secondary cell modules 3.

The degradation level estimation unit 30 estimates the degradation levels of cell-module performance of the plurality of secondary cell modules 3, based on the history information items acquired by the history information collection unit 10 and the cell performance acquired by the cell performance collection unit 20.

The prediction unit 40 predicts the suppliable quantity of power of each of the reusable secondary cell modules 3 in accordance with the degradation level of the cell-module performance of a corresponding one of the plurality of secondary cell modules 3.

The supply balance setting unit 50 sets the power supply balance among the secondary cell modules 3, based on the suppliable quantity of power of each of the secondary cell modules predicted by the prediction unit 40.

Hereinafter, a system for setting power supply of reusable secondary cell modules 1 in the present embodiment will be described in detail. The system for setting power supply of reusable secondary cell modules 1 will hereinafter be also called "system for setting power supply 1".

As shown in FIG. 1, the system for setting power supply 1 in the present embodiment is used for the purpose of reuse of the secondary cell modules 3. For a recycled module provider X that provides the secondary cell modules 3 to be reused and replacement and repair service providers Y1 and Y2 that provide replacement and repair service of the cell pack 2 with the recycled secondary cell modules 3, it is important to determine when secondary cell modules 3 will be supplied, at what levels of cell performance, and in what quantity, in formulation of a material procurement schedule and a production schedule, and preparing for service provision.

As shown in FIG. 2, the system for setting power supply 1 of the present embodiment is made available by the recycled module provider X and the replacement and repair service providers Y1 and Y2. The system for setting power supply 1 sets a supply balance in recycle of the secondary cell modules 3 in the cell pack 2 as a battery to be mounted in a vehicle. The secondary cells constituting the secondary cell modules 3 can be, for example, lithium-ion secondary cells, nickel-hydrogen secondary cells, lead secondary cells, or the like. The cell pack 2 shown in FIG. 2 was mounted in secondhand vehicles and used in different environments. The plurality of secondary cell modules 3 is included in the cell pack 2 and varies in degradation level and cell performance after use for a predetermined time period, partially due to the usage environments and the individual differences among the secondary cell modules 3.

The history information collection unit 10 shown in FIG. 2 collects a history information item on how each of a plurality of secondary cell modules 3 has been used. The history information items may include the temperature, electric current, SOC, and period of use of the secondary cell modules 3, the running distance of the vehicle equipped with the secondary cell modules 3, the frequency of recharging, and the like. The history information collection unit 10 can be formed of a battery management unit (BMU) mounted to the cell pack 2. The history information items of the collected secondary cell modules 3 are stored in a storage unit 60. The storage unit 60 is formed of a rewritable non-volatile memory.

The cell performance collection unit 20 shown in FIG. 2 acquires the cell-module performance of the secondary cell modules 3. The cell performance may include capacity, input/output power, self-discharge rate, and the like. For example, the cell performance collection unit 20 can be formed of a battery management unit (BMU) mounted to the cell pack 2. The acquired cell-module performance of the secondary cell modules 3 are stored in the storage unit 60. Alternatively, a cell performance collection device as the cell performance collection unit 20 may be provided outside the vehicle, for example, in a charging stand or the like, to collect the cell-module performance of the secondary cell modules 3. Alternatively, a vehicle dealer or the like may collect the cell-module performance of the secondary cell modules 3 by using a cell performance collection device as the cell performance collection unit 20. Otherwise, a recycled module provider may collect the cell-module performance of the secondary cell modules 3 by using a cell performance collection device.

The degradation level estimation unit 30 shown in FIG. 2 estimates the future degradation levels of the secondary cell modules 3, based on the history information items acquired by the history information collection unit 10 and the cell performance acquired by the cell performance collection unit 20. The degradation level estimation unit 30 is formed of an arithmetic device such as a CPU executing a program for estimating the degradation level. For example, the degradation level estimation unit 30 may be formed of an on-board battery management unit (BMU) mounted to the cell pack 2 or an externally provided degradation level estimation device that executes a predetermined program. When such an externally provided degradation level estimation device is utilized, the history information items and the cell performance can be wirelessly retrieved from the BMU in the cell pack 2 via a wireless communication device connected to the cell pack 2, or the history information items and the cell performance may be retrieved by wire from the BMU in the cell pack 2 via an external connection terminal of the BMU in the cell pack 2.

The degradation level estimation unit 30 can estimate the degradation levels by a publicly known method. The degradation level estimation unit 30 can rank the secondary cell modules 3 in accordance with the estimated degradation levels. For example, the degradation level estimation unit 30 can divide the secondary cell modules 3 into two ranks, a rank A where the estimated degradation levels are relatively low and a rank B where the estimated degradation levels are relatively high. Since secondary cell modules 3 having significantly high degradation levels are not suitable for reuse, they may be decomposed and recycled for material by the recycling business operator shown in FIG. 1.

The changes in the degradation levels of the secondary cell modules 3 vary depending on the type of the vehicle to which the cell pack 2 including the secondary cell modules 3 is mounted. In addition, the changes in the degradation levels of the secondary cell modules 3 may also vary due to specification changes in the program of the BMU depending on the timing when the vehicle was manufactured. The changes in the degradation levels of the secondary cell modules 3 may also vary due to the environment in which the vehicle was used. The allowable range of variation in the cell performance among the plurality of secondary cell modules 3 varies depending on the destination and the vehicle type. For example, upper and lower limits of an allowable range Ra for a destination A and a vehicle type S shown in FIG. 3A has are lower than upper and lower limits of an allowable range Rb for a destination B and a vehicle type T shown in FIG. 3B.

For the destination A and the vehicle type S shown in FIG. 3A, among the plurality of secondary cell modules 3 provided in the cell pack 2, a secondary cell module 3x under the lower limit of the allowable range Ra needs to be replaced by another secondary cell module with cell performance within the allowable range Ra and be repaired. Since the allowable range Ra for the destination A and the vehicle type S shown in FIG. 3A is in a relatively low region, the secondary cell module 3x after replacement and repair can be a secondary cell module 3b having a rank of B with a relatively high degradation level as shown in FIG. 3C.

For the destination B and the vehicle type T shown in FIG. 3B, among the plurality of secondary cell modules 3 provided in the cell pack 2, a secondary cell module 3y under the lower limit of the allowable range Rb needs to be replaced by another secondary cell module with cell performance within the allowable range Rb and be repaired. Since the allowable range Rb for the destination B and the vehicle type T shown in FIG. 3B is in a relatively high region, the secondary cell module 3y after replacement and repair needs to be a secondary cell module 3a having a rank of A with a relatively low degradation level as shown in FIG. 3D. In this way, the cell-module performance of the secondary cell modules 3 required at the time of replacement and repair varies depending on the differences between the destinations A and B where the cell pack 2 will be used and the vehicle types S and T of the vehicles in which the cell pack 2 will be mounted.

The prediction unit 40 shown in FIG. 2 predicts the suppliable quantity of power of each of the reusable secondary cell modules 3 in accordance with the degradation level of the cell-module performance of a corresponding one of the plurality of secondary cell modules 3. The suppliable quantity of power can be predicted in each rank from the results of estimation by the degradation level estimation unit 30, based on, for example, the temporal transition of vehicle residual rate after vehicle registration shown in FIG. 4A and the temporal transition of the vehicle composition ratio shown in FIG. 4B. The transition of the vehicle residual rate shown in FIG. 4A and the transition of the vehicle composition ratio are stored in advance in a memory unit 65.

The supply balance setting unit 50 shown in FIG. 2 sets the future power supply balance among the secondary cell modules 3 based on the results of estimation by the degradation level estimation unit 30. The "power supply balance among the secondary cell modules 3" indicates the secondary cell modules 3 at what degradation level to be arranged to the destination in what suppliable quantity of power. The supply balance can be set according to the ranks based on the results of estimation by the degradation level estimation unit 30. For example, the supply balance setting unit 50 can set the supply balance so as to increase the suppliable quantity of power to the destination of the secondary cell modules 3 having a rank in which the future suppliable quantity of power of the secondary cell modules 3 is predicted to be large, and decrease the suppliable quantity of power of the secondary cell modules 3 having a rank in which the future suppliable quantity of power of the secondary cell modules 3 is predicted to be small. The supply balance setting unit 50 can set the supply balance to meet the demand, in accordance with the results of estimation by the degradation level estimation unit 30 and the results of demand prediction by a demanded quantity prediction unit 70 described later.

In the present embodiment, as shown in FIG. 2, the system for setting power supply 1 has the demanded quantity prediction unit 70. The demanded quantity prediction unit 70 predicts the demanded quantity of power for each of the secondary cell modules 3. The demand for the secondary cell modules 3 can be predicted in accordance with the cell-module performance of the secondary cell modules 3. For example, the future demand for the secondary cell modules 3 can be predicted from region, vehicle type, age, travelable distance, cumulative failure rate, capacity retention rate, and the like.

Figure 5A:
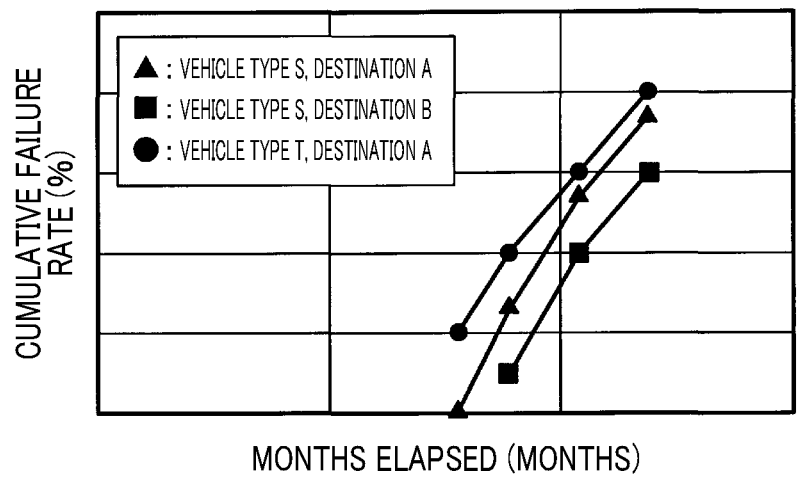
FIG. 5A is a diagram showing Weibull distribution of failure rate and months elapsed in the first embodiment.
Figure 5B:
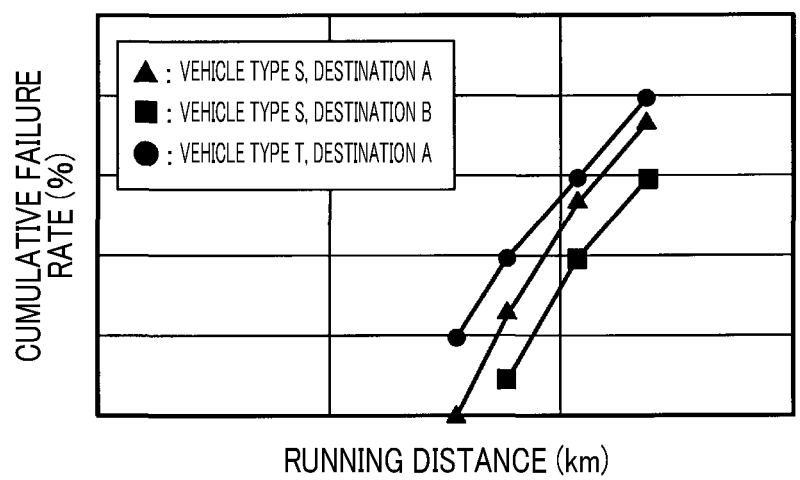
FIG. 5B is a diagram showing Weibull distribution of failure rate and running distance in the first embodiment.
Figure 6A:
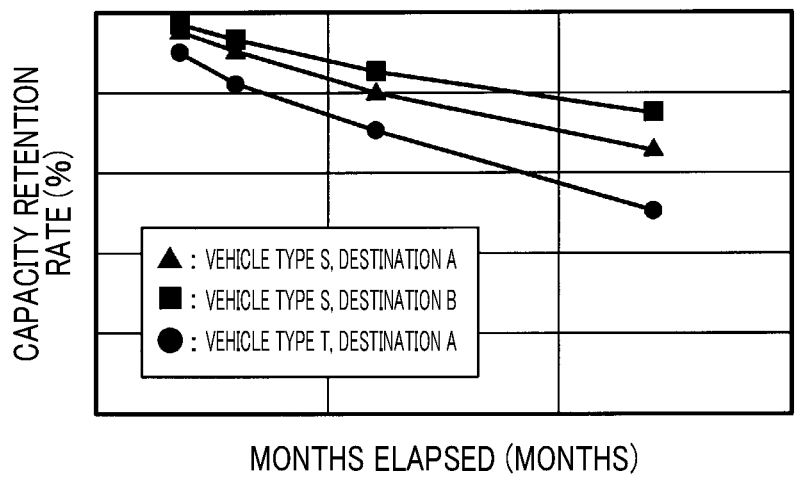
FIG. 6A is a diagram showing the relationship between capacity retention rate and months elapsed in the first embodiment.
Figure 6B:
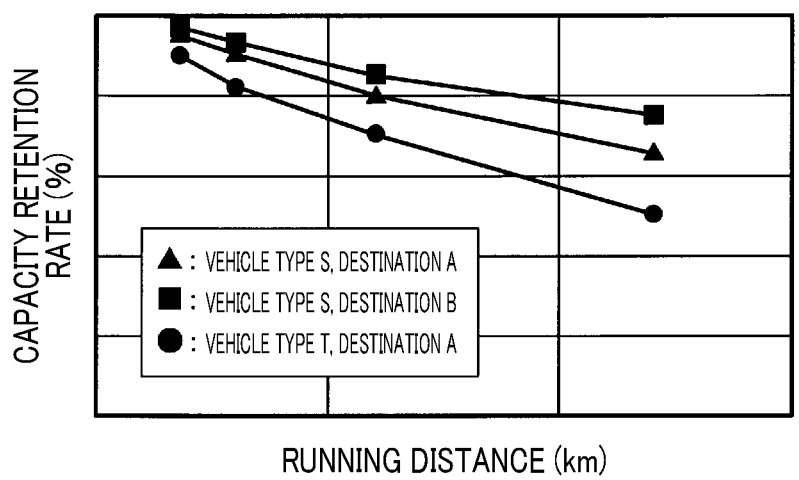
FIG. 6B is a diagram showing the relationship between capacity retention rate and running distance in the first embodiment.

In the present embodiment, the demanded quantity prediction unit 70 predicts the future demand for the secondary cell modules 3, based on a Weibull distribution of the failure rates and months elapsed for the destinations A and B and the vehicle types S and T shown in FIG. 5A, and a Weibull distribution of the failure rates and running distances for the destinations A and B and the vehicle types S and T shown in FIG. 5B. Otherwise, the demanded quantity prediction unit 70 may predict the future demand for the secondary cell modules 3, based on the relationship between the capacity retention rate and months elapsed for the destinations A and B and the vehicle types S and T shown in FIG. 6A and the relationship between the capacity retention rate and the running distance for the destinations A and B and the vehicle types S and T shown in FIG. 6B.

In the present embodiment, as shown in FIG. 2, the system for setting power supply 1 includes a display unit 80 that displays at least one of the display unit 80 displays at least one of the suppliable quantity of power of each of the secondary cell modules predicted by the prediction unit 40; and the power supply balance among the secondary cell modules set by the supply balance setting unit 50. Based on the information displayed on the display unit 80, the replacement and repair service providers Y1 and Y2 requiring the secondary cell modules 3 as recycled products can check the supply prediction and power supply balance among the secondary cell modules 3 at desired degradation levels.

In the present embodiment, the system for setting power supply 1 includes an information adding unit 85 to add, to each of the secondary cell modules 3, information associated with the power supply balance among the secondary cell modules 3. The information provided by the information adding unit 85 can be the destination where the secondary cell modules will be used, the degradation levels of the cell performance, and the like. The information can be provided by sticking a tag or a two-dimensional code containing the information to the secondary cell modules 3 or adding the information to a two-dimensional code 31 stuck in advance to the secondary cell modules 3 as shown in FIG. 2.

In the present embodiment, the system for setting power supply 1 includes an arrangement unit 90 to arrange the plurality of secondary cell modules 3, based on the power supply balance among the secondary cell modules set by the supply balance setting unit 50. The arrangement unit 90 is configured to refer to the information added to each of the secondary cell modules by the information adding unit 85 to accordingly arrange the plurality of secondary cell modules 3. For example, the arrangement unit 90 is configured to automatically arrange the plurality of secondary cell modules 3 for each of the destinations where the secondary cell modules 3 will be used. In the present embodiment, the cell pack 2 comprises a plurality of cell pack components 4, the arrangement unit 90 is further configured to, arrange the cell pack components 4 in addition to arrangement of the plurality of secondary cell modules 3 as shown in FIG. 2.

Next, the use mode of the system for setting power supply 1 will be described with reference to the flowchart of FIG. 7.

Figure 7:
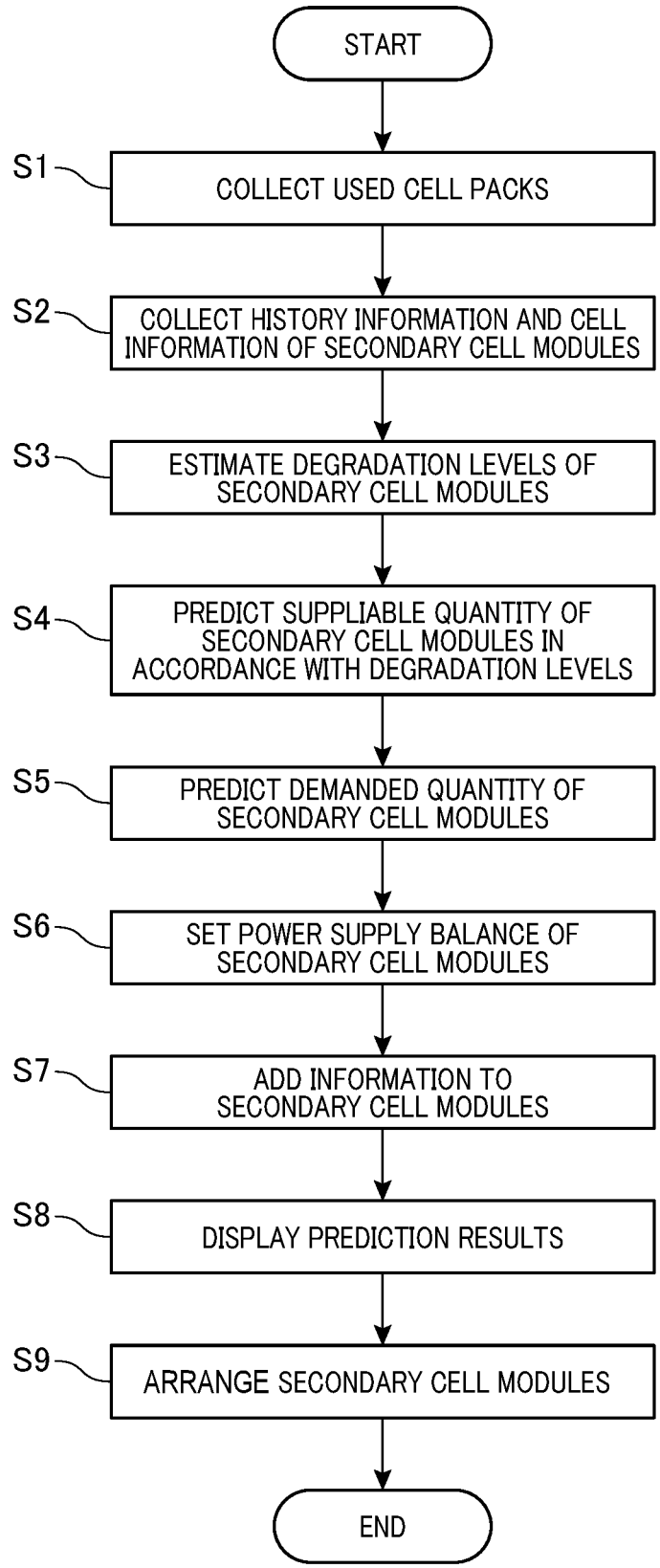
FIG. 7 is a flowchart showing a use mode of the system for setting power supply in the first embodiment.

First, in step S1 shown in FIG. 7, the used cell packs 2 are collected. Then, all the secondary cell modules 3 are removed from the collected cell packs 2. After that, in step S2, the history information collection unit 10 acquires the history information items of the plurality of secondary cell modules 3. The cell performance collection unit 20 acquires the cell-module performance of the plurality of secondary cell modules 3. The acquired information items are stored in the storage unit 60 respectively.

Next, in step S3 shown in FIG. 7, the degradation level estimation unit 30 estimates the degradation level of the secondary cell modules 3, based on the history information items and cell-module performance of the secondary cell modules 3. In the present embodiment, the secondary cell modules 3 are ranked in a rank A or a rank B in accordance with the degradation levels. In step S4, the prediction unit 40 predicts the suppliable quantity of power of the secondary cell modules 3 for each of the degradation level ranks.

Next, in step S5 shown in FIG. 7, the demanded quantity prediction unit 70 predicts the demanded quantity of power for each of the secondary cell modules 3. In the present embodiment, the demanded quantity prediction unit 70 predicts the demanded quantity of power for each of the secondary cell modules 3 for the destination A and the destination B in accordance with the degradation levels.

In step S6 shown in FIG. 7, the supply balance setting unit 50 sets the power supply balance among the secondary cell modules 3, based on the prediction results of suppliable quantity of power of the secondary cell modules 3 and the results of prediction by the demanded quantity prediction unit 70. After that, the information adding unit 85 provides the information based on the supply balance to the secondary cell modules 3. Then, in step S8, the display unit 80 displays the supply prediction and power supply balance among the secondary cell modules 3 in accordance with a user request.

In step S9 shown in FIG. 7, based on the supply balance, the arrangement unit 90 arranges the secondary cell modules 3 for each of the destination A and the destination B, each of the vehicle type S and the vehicle type T. In the present embodiment, the cell pack 2 comprises a plurality of cell pack components 4; and the arrangement unit 90 is configured to arrange the cell pack components 4 in addition to arrangement of the plurality of secondary cell modules 3.

Next, operational effects of the system for setting power supply 1 in the present embodiment will be described in detail.

In the system for setting power supply 1 of the present embodiment, the history information items and cell-module performance of each of the secondary cell modules 3 constituting the cell pack 2 are acquired to estimate the degradation levels of the secondary cell modules 3. Based on the estimation results, the suppliable quantity of power of the reusable secondary cell modules 3 is predicted in accordance with the cell performance. Then, based on the prediction results of the suppliable quantity of power, the power supply balance among the secondary cell modules 3 is set in accordance with the cell performance. Accordingly, the supply balance is set in accordance with the cell performance in units of secondary cell modules, and thus it is possible to set the power supply balance among the secondary cell modules 3 with high accuracy. As a result, it is possible to improve the reuse rate of the secondary cell modules 3.

In the present embodiment, the system for setting power supply 1 includes the demanded quantity prediction unit 70 predicting the demand quantity of power for each of the secondary cell modules 3, and the supply balance setting unit 50 sets the power supply balance in accordance with the demanded quantity of power for each of the secondary cell modules predicted by the demanded quantity prediction unit 70, based on the suppliable quantity of power of each of the secondary cell modules predicted by the prediction unit. Accordingly, the power supply balance among the secondary cell modules 3 is set in accordance with the demand for the secondary cell modules 3, which further improves the reuse rate of the secondary cell modules 3.

In the present embodiment, the system for setting power supply 1 includes the display unit 80, the display unit 80 displays at least one of the suppliable quantity of power of each of the secondary cell modules predicted by the prediction unit 40; and the power supply balance among the secondary cell modules set by the supply balance setting unit 50. Accordingly, the recycled module provider X and the replacement and repair service providers Y1 and Y2 can easily obtain the suppliable quantity of power prediction results and the supply balance.

In the present embodiment, the system for setting power supply 1 includes the arrangement unit 90, the arrangement unit 90 arranges the plurality of secondary cell modules 3 based on the power supply balance among the secondary cell modules set by the supply balance setting unit 50. This facilitates the arrangement of the secondary cell modules 3, which improves work efficiency.

In the present embodiment, the system for setting power supply 1 includes the information adding unit 85, the information adding unit 85 adds, to each of the secondary cell modules 3, information associated with the power supply balance among the secondary cell modules 3, and the arrangement unit 90 refers to the information added to each of the secondary cell modules by the information adding unit 85 to accordingly arrange the plurality of secondary cell modules 3. This further facilitates the arrangement of the secondary cell modules 3, thereby improving work efficiency. In addition, the arranged secondary cell modules 3 can be tracked based on the information provided by the information adding unit 85, which improves the accuracy of quality control.

In the present embodiment, the cell pack 2 comprises a plurality of cell pack components 4, the arrangement unit 90 is configured to, arrange the cell pack components 4 in addition to arrangement of the plurality of secondary cell modules 3. This eliminates the need to procure separate components constituting the cell pack 2, which improves the efficiency of fabricating the cell pack 2.

In the present embodiment, the cell pack 2 constituted by the plurality of secondary cell modules 3 is configured to be installable in various types of vehicles different from each other such as vehicle types S and T. Accordingly, the system for setting power supply 1 of the present embodiment facilitates the reuse of the secondary cell modules 3 across the plurality of vehicle types, which further improves the reuse rate of the secondary cell modules 3.

In the present embodiment, the supply balance setting unit 50 is configured to set the power supply balance among the plurality of secondary cell modules in accordance with at least one of: (i) a type of a vehicle in which the cell pack 2 including the plurality of secondary cell modules 3 are to be used; (ii) a region in which the cell pack 2 including the plurality of secondary cell modules 3 are to be used; (iii) a remaining life of the cell pack; and (iv) a travelable distance of a vehicle equipped with the cell pack. This further improves the reuse rate of the secondary cell modules 3.

As stated above, according to the present embodiment, it is possible to provide the system for setting power supply 1 of the reusable secondary cell modules 3 that improves the reuse rate of the secondary cell modules 3.

The present disclosure is not limited to the foregoing embodiments but is applicable to various embodiments without departing from the gist of the present disclosure.

The present disclosure has been described in accordance with embodiments but is not limited to the embodiments, structures, and the like. The present disclosure also includes various modifications and changes in a range of equivalency. In addition, various combinations and modes, and other combinations and modes including only one element of the foregoing combinations and modes, less or more than the one element are included in the scope and conceptual range of the present disclosure.

What is claimed is:

1. A system for setting power supply of reusable secondary cell modules, the system comprising:
   a history information collection unit configured to collect a history information item on how each of a plurality of secondary cell modules has been used, the plurality of secondary cell modules constituting a cell pack;
   a cell performance collection unit configured to collect a cell-module performance of each of the plurality of secondary cell modules;
   a degradation level estimation unit configured to estimate a degradation level of the cell-module performance of each of the plurality of secondary cell modules, based on:
      the history information items about the respective secondary cell modules acquired by the history information collection unit;
      the cell-module performances of the respective secondary cell modules collected by the cell performance collection unit; and
      at least one of (i) a model of a vehicle in which each of the plurality of secondary cell modules has been used and (ii) a region in which each of the plurality of secondary cell modules has been used;
   a suppliable quantity prediction unit configured to predict a suppliable quantity of power of each of the plurality of secondary cell modules in accordance with the degradation level of the cell-module performance of a corresponding one of the plurality of secondary cell modules;
   a demanded quantity prediction unit configured to predict a demanded quantity of power for each of the plurality of secondary cell modules based on an allowable range of battery performance, the allowable range of battery performance being set according to:
      at least one of (i) a model of a vehicle in which each of the plurality of secondary cell modules is to be used and (ii) a region in which each of the plurality of secondary cell modules is to be used; and
      at least one of (i) a remaining life of each of the plurality of secondary cell modules and (ii) a travelable distance of the model of the vehicle in which each of the plurality of secondary cell modules is to be used; and
   a supply balance setting unit configured to set a power supply balance among the plurality of secondary cell modules based on (i) the suppliable quantity of power of each of the plurality of secondary cell modules predicted by the suppliable quantity prediction unit and (ii) the demanded quantity of power of each of the plurality of secondary cell modules predicted by the demanded quantity prediction unit, wherein
   the cell pack constituted by the plurality of secondary cell modules is configured to be installable in various models of vehicles different from each other.

2. The system for setting power supply of reusable secondary cell modules according to claim 1, wherein
   the suppliable quantity prediction unit is configured to predict the suppliable quantity of power of each of the plurality of secondary cell modules for each of ranks of the degradation level of the plurality of secondary cell modules, and the demanded quantity prediction unit is configured to predict the demanded quantity of power for each of the plurality of secondary cell modules for each of the ranks of the degradation level of the plurality of secondary cell modules.

3. The system for setting power supply of reusable secondary cell modules according to claim 1, further comprising:

a display unit configured to display at least one of:
the suppliable quantity of power of each of the plurality of secondary cell modules predicted by the suppliable quantity prediction unit; and
the power supply balance among the plurality of secondary cell modules set by the supply balance setting unit.

4. The system for setting power supply of reusable secondary cell modules according to claim 1, further comprising:

an arrangement unit configured to arrange the plurality of secondary cell modules, based on the power supply balance among the plurality of secondary cell modules set by the supply balance setting unit.

5. The system for setting power supply of reusable secondary cell modules according to claim 4, further comprising:

an information adding unit configured to add, to each of the plurality of secondary cell modules, information associated with the power supply balance among the plurality of secondary cell modules, wherein
the arrangement unit is configured to refer to the information added to each of the plurality of secondary cell modules to accordingly arrange the plurality of secondary cell modules.

6. The system for setting power supply of reusable secondary cell modules according to claim 4, wherein
the cell pack comprises a plurality of cell pack components; and
the arrangement unit is configured to arrange the cell pack components in addition to arrangement of the plurality of secondary cell modules.

* * * * *